(12) United States Patent
Wodnicki et al.

(10) Patent No.: US 7,781,238 B2
(45) Date of Patent: Aug. 24, 2010

(54) METHODS OF MAKING AND USING INTEGRATED AND TESTABLE SENSOR ARRAY

(76) Inventors: Robert Gideon Wodnicki, 1509 Dorwaldt Blvd., Niskayuna, NY (US) 12309; Stacey Joy Kennerly, 4 Wilson Ct., Albany, NY (US) 12205; Wei-Cheng Tian, 6 Highland Oaks, Clifton Park, NY (US) 12065; Kevin Matthew Durocher, 28 Copperfield Dr., Waterford, NY (US) 12188; David Martin Mills, 1915 Heritage Rd., Niskayuna, NY (US) 12309; Charles Gerard Woychik, 1011 Catherine Woods Dr., Niskayuna, NY (US) 12309; Lowell Scott Smith, 24 Cheshire Pl., Niskayuna, NY (US) 12309

( * ) Notice: Subject to any disclaimer, the term of this patent is extended or adjusted under 35 U.S.C. 154(b) by 67 days.

(21) Appl. No.: 11/951,360

(22) Filed: Dec. 6, 2007

(65) Prior Publication Data

US 2009/0148967 A1    Jun. 11, 2009

(51) Int. Cl.
*H01L 21/66* (2006.01)
(52) U.S. Cl. .............. 438/17; 438/14; 438/49; 257/E21.529; 257/E21.522
(58) Field of Classification Search ............ 438/14, 438/17, 114, 49; 257/E21.529, E21.522, 257/E21.521
See application file for complete search history.

(56) References Cited

U.S. PATENT DOCUMENTS

| 6,551,248 | B2 | 4/2003 | Miller |
| 6,562,650 | B2 | 5/2003 | Ladabaum |
| 6,589,180 | B2 | 7/2003 | Erikson et al. |
| 6,713,828 | B1 * | 3/2004 | Chavan et al. ............. 257/415 |
| 6,730,997 | B2 | 5/2004 | Beyne et al. |
| 6,908,856 | B2 | 6/2005 | Beyne et al. |
| 6,984,571 | B1 | 1/2006 | Enquist |

(Continued)

FOREIGN PATENT DOCUMENTS

WO    01/26137 A2    4/2001

OTHER PUBLICATIONS

Abele, P. et al., "Wafer level integration of a 24 GHz differential SiGe-MMIC oscillator with a patch antenna using BCB as a dielectric layer"; 33rd European Microwave Conference, Munich 2003.

(Continued)

*Primary Examiner*—Caridad M Everhart
(74) *Attorney, Agent, or Firm*—Jason K. Klindtworth

(57) ABSTRACT

A method for making a testable sensor assembly is provided. The method includes forming a first sensor array on a first substrate having a first side and a second side, wherein the first sensor array is formed on the first side of the first substrate, coupling a first semiconductor wafer having a first side and a second side to the first sensor array, wherein the first side of the first semiconductor wafer is coupled to the first sensor array, thinning one of the second side of the first substrate or the second side of the first semiconductor wafer, and testing the first sensor array to identify operational and non-operational units in the testable sensor assembly before integration of the sensor assembly with interface electronics.

22 Claims, 13 Drawing Sheets

U.S. PATENT DOCUMENTS

| | | |
|---|---|---|
| 7,037,755 B2 | 5/2006 | Enquist |
| 2002/0005580 A1* | 1/2002 | Goodman et al. ........... 257/734 |
| 2003/0032211 A1 | 2/2003 | Ladabaum |
| 2004/0018667 A1* | 1/2004 | Joshi et al. ................. 438/126 |
| 2004/0141421 A1 | 7/2004 | Cheng et al. |
| 2005/0023656 A1* | 2/2005 | Leedy .......................... 257/678 |
| 2005/0094490 A1 | 5/2005 | Thomenius et al. |
| 2005/0096546 A1 | 5/2005 | Hazard et al. |
| 2005/0169107 A1 | 8/2005 | Thomenius et al. |
| 2006/0075818 A1 | 4/2006 | Huang et al. |
| 2006/0292866 A1* | 12/2006 | Borwick et al. ............. 438/667 |
| 2007/0052700 A1 | 3/2007 | Wheeler et al. |
| 2007/0108459 A1* | 5/2007 | Lu ................................. 257/98 |
| 2008/0083959 A1* | 4/2008 | Wu et al. ..................... 257/416 |
| 2008/0106602 A1* | 5/2008 | Nussbacher ................. 348/187 |
| 2009/0020842 A1* | 1/2009 | Shiau et al. .................. 257/459 |

OTHER PUBLICATIONS

Mc Mahon, J.J et al., "Wafer bonding of damascene-patterned metal/adhesive redistribution layers for via-first three-dimensional (3D) interconnect"; Electronic Components and Technology Conference, 2005.

Guarini, K.W. Topol, A.W. Ieong, M. Yu, R. Shi, L. Newport, M.R. Frank, D.J. Singh, D.V. Cohen, G.M. Nitta, S.V. Boyd, D.C. O'Neil, P.A. Tempest, S.L. Pogge, H.B. Purushothaman, S. Haensch, W.E.; "Electrical integrity of state-of-the-art 0.13 /spl mu/m SOI CMOS devices and circuits transferred for three-dimensional (3D) integrated circuit (IC) fabrication"; Electron Devices Meeting, 2002. IEDM '02. Digest. International; pp. 943-945.

* cited by examiner

METHODS OF MAKING AND USING INTEGRATED AND TESTABLE SENSOR ARRAY

STATEMENT REGARDING FEDERALLY SPONSORED RESEARCH & DEVELOPMENT

This invention was made with Government support under contract number 1 RO1 EB002485-01 awarded by National Institutes of Heath. The Government has certain rights in the invention.

BACKGROUND

The invention relates generally to fabrication of wafer assemblies, and more particularly to fabrication of arrays of transducers and/or sensors, such as those used in ultrasonic systems.

Ultrasonic systems, such as systems utilizing capacitor micromachined ultrasonic transducers (cMUTs), have been used in multiple applications ranging from non-destructive evaluations to medical diagnostics and therapy. CMUT based systems may integrate multiple units, such as microelectromechanical system (MEMS) devices and complementary metal oxide semiconductor (CMOS) chips/dies, where such devices work in conjunction with one another. The MEMS devices employed in such systems are, typically, fabricated in multiple arrays on a wafer. Accordingly, the CMOS devices may be used to control the operation of the transducers and/or sensors. The CMOS dies are, typically, fabricated using standard fabrication methods, which may include very large scale integration (VLSI) or ultra large scale integration (ULSI) fabrication methods. Accordingly, fabrication of the CMOS dies is performed on wafers that are separate from those on which the MEMS devices are fabricated.

Current fabrication methods for integrating MEMS and CMOS devices are relatively expensive and provide a relatively low yield. Further, current fabrication methods fail to integrate MEMS and CMOS arrays at fine pitches using current industry standards. Conventionally, either an interposer having through wafer vias, and/or electrical bump bonds are employed for integrating MEMS and CMOS devices. However, both of these techniques are relatively expensive for systems with high channel count. Also, as the input/output (I/O) pitch decreases below 180 microns, it becomes even more challenging to interconnect both the wafers using a conventional flip chip attach method, especially when one or more of the wafers are thinned. Occasionally, MEMs arrays are directly fabricated on top of a silicon CMOS wafer, but this technique suffers from a number of issues including combined CMOS/MEMs yield.

Therefore there is a need to explore new methods and devices to integrate MEMS arrays with an array of CMOS devices, both fabricated on separate substrates.

BRIEF DESCRIPTION

In one embodiment, a method for making a testable sensor assembly is provided. The method includes forming a first sensor array on a first substrate having a first side and a second side, wherein the first sensor array is formed on the first side of the first substrate, coupling a first semiconductor wafer having a first side and a second side to the first sensor array, wherein the first side of the first semiconductor wafer is coupled to the first sensor array, thinning one of the second side of the first substrate or the second side of the first semiconductor wafer, and testing the first sensor array to identify operational and non-operational units in the testable sensor assembly before integration of the sensor assembly with interface electronics.

In another embodiment, a method for making an integrated and testable MEMS array is provided. The method includes forming a first plurality of MEMS cavities on a first substrate having a first side and a second side, wherein the first plurality of cavities are formed on the first side of the first substrate, coupling a second substrate having a first side and a second side to the first plurality of MEMS cavities such that the first side of the second substrate is coupled to the first plurality of MEMS cavities, thinning a second side of one of the first or second substrates such that at least a portion of a semiconductor layer of one of the first or second substrates is exposed, coupling a third substrate having a first side and a second side to the exposed silicon layer, wherein the third SOI wafer comprises a second plurality of cavities disposed on the first side, and wherein the second plurality of cavities are coupled to the exposed semiconductor layer, such that the exposed semiconductor layer is configured to act as free internal membranes for the MEMS array; thinning the second side of one of the first, second or third substrates to expose an insulation layer such that the exposed silicon layer is configured to act as free internal membranes for the MEMS array, testing the MEMS array to determine good and bad free internal membranes, coupling a plurality of integrated circuit dies to the exposed insulation layer, wherein each of the plurality of integrated dies is coupled to portions of the good free internal membranes, and removing the second side of the remaining first, second, or third substrates.

In yet another embodiment, a method for making an integrated and testable sensor array is provided. The method includes forming a first plurality of sensor cavities on a first side of a first substrate, wherein the first substrate comprises a first side and a second side, coupling a second substrate to the first plurality of sensor cavities, thinning a second side of one of the first or second substrates such that at least a portion of a semiconductor layer of one of the first or second substrates is exposed to form a first exposed semiconductor layer, coupling a semiconductor wafer having a first side and a second side to the first exposed semiconductor layer, wherein the semiconductor wafer comprises a second plurality of sensor cavities disposed on the first side of the semiconductor wafer, and wherein the second plurality of sensor cavities is coupled to the first exposed semiconductor layer, and wherein the first exposed semiconductor layer forms an internal membrane for the second plurality of MEMS cavities, thinning the second side of one of the other of the first or the second substrates to expose an insulation layer to form the integrated and testable sensor array, and testing the internal membranes to determine operational and non-operational MEMS units of the array before coupling the sensor array with interface electronics.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail below, the present technique provides ways to fabricate a sensor array that makes it amenable to test the sensor array before integration with the interface electronics, such as complementary metal oxide semiconductor (CMOS), double-diffused metal oxide semiconductor (DMOS), SiGe, BiCMOS, GaN, and the like. The testing of the sensor array to identify good and bad sensor units makes it feasible to integrate only good sensor units with the interface electronics, thereby improving the yield of the fabrication process. The present technique also provides methods to merge a large array of sensors with a large array of interface electronics where the two are fabricated on separate substrates and also have a series of stacked chips behind the sensor die. For example, methods for interfacing microelectrical mechanical systems (MEMS) sensor array with high yield, low cost and low power while allowing fine pitch are viable with use of the present technique. The techniques disclosed herein offer a viable method to interconnect both die using currently available materials and assembly technology, and to accommodate transducer pitch below 100 microns.

Figure 1A:
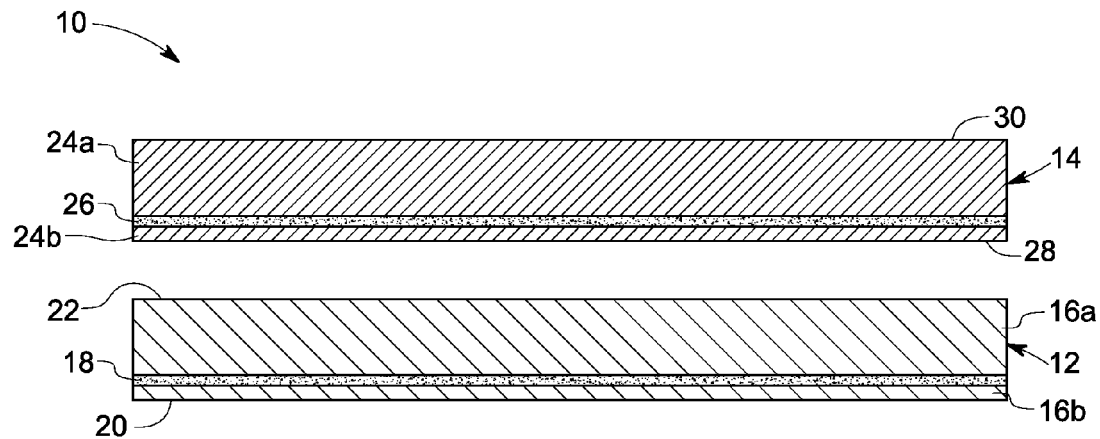
FIGS. 1A-1K illustrate a fabrication method for a testable MEMS sensor array, in accordance with an exemplary embodiment of the present technique.

Referring to FIG. 1A, an initial step of the fabrication process for making the integrated and testable sensor array is illustrated. In the illustrated embodiment, the sensor array comprises a MEMS array. However, it should be appreciated that the sensor array may include other units, such as photodiodes, chemical sensors, etc. The wafer stack 10 includes a first substrate 12 and a second substrate 14. As used herein, the term "substrate" includes a semiconductor-on-insulator wafer that has an insulator layer disposed between a bulk semiconductor wafer and a relatively thin semiconductor layer. The bulk semiconductor wafer and the semiconductor layer may be made of either same, or different semiconductor materials. Non-limiting examples of the semiconductor materials may include silicon, silicon carbide and gallium nitride. The insulation layer may be made of an insulation material, such as silicon dioxide ($SiO_2$) or sapphire. In one embodiment, the insulating layer may be embedded within the bulk wafer using, for example, ion implantation such that the insulation layer is disposed very near the bottom side of the bulk wafer. That is, the insulation layer is disposed very near the bottom surface of the bulk silicon wafer such that a very thin layer of bulk silicon material may separate the insulation layer from the outer surfaces of the bulk wafer. In so doing, the insulation layer is adapted to provide an etch stop once the bulk wafer is etched in subsequent processing steps, as described further below. The use of a semiconductor-on-insulator wafer in the sensor array facilitates lower parasitic capacitance, due to isolation provided by the bulk silicon. This results in improved (lower) power consumption while maintaining performance. In one embodiment, the semiconductor-on-insulator wafer includes a silicon-on-insulator (SOI) wafer. It should be noted that although the illustrated embodiments are described mostly with respect to one or more SOI wafers, however, other semiconductor-on-insulators may also be employed in the embodiments of the present technique.

Returning to FIG. 1A, the first substrate or SOI wafer 12 includes a bulk silicon wafer 16a having an insulation layer 18 disposed on top, and a semiconductor layer, such as a silicon layer 16b, disposed on the insulation layer 18. The first SOI wafer 12 includes a first side 20 and a second side 22 such that the insulation layer 18 is closer to the first side 20. Similarly, the second substrate or SOI wafer 14 includes an insulation layer 26 disposed between a bulk wafer 24a and a silicon layer 24b. The second SOI wafer 14 has a first side 28 and a second side 30.

Figure 1B:
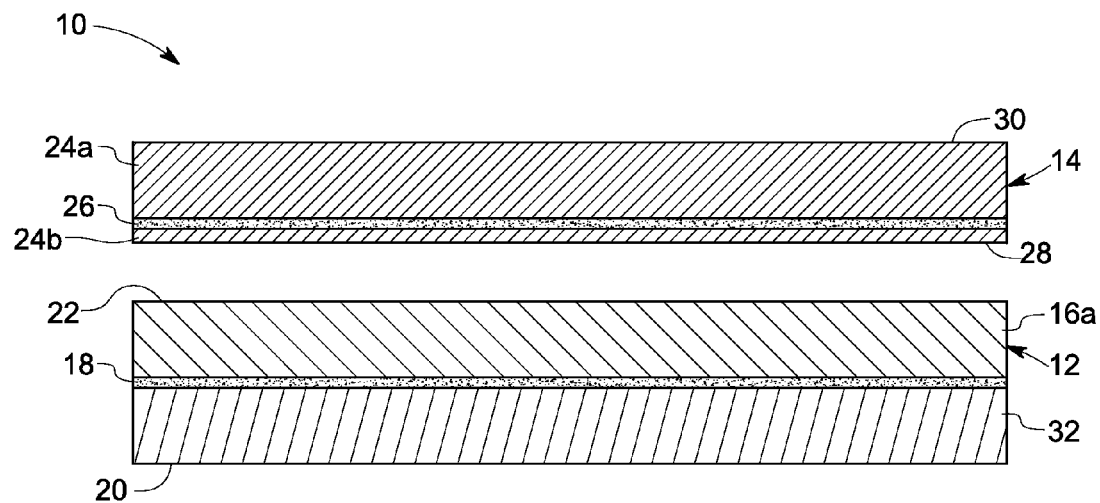

As illustrated in FIG. 1B, a silicon layer 32 is formed on the first side 20 of the first SOI wafer 12. In one embodiment, the silicon layer 32 is relatively thinner than the bulk silicon layer 16a of the first SOI wafer 12. The silicon layer 32 is made highly conductive by doping. The silicon layer 32 may be either n-type doped or p-type doped. Non-limiting examples of dopants may include one or more of aluminum, phosphor, boron, carbon, zinc magnesium, or germanium.

Figure 1C:
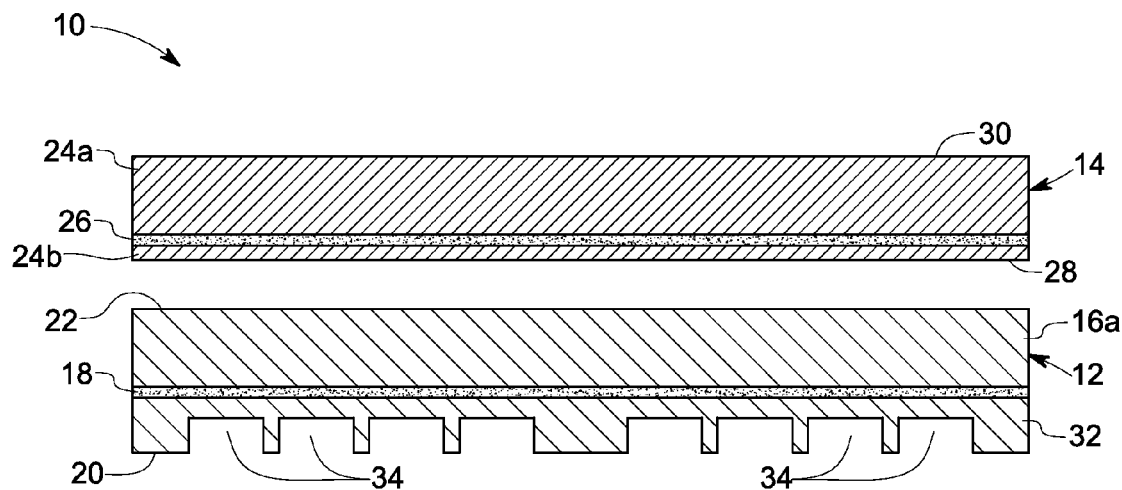

FIG. 1C illustrates a subsequent fabrication step in which the silicon layer 32 is micromachined to form cavities 34 at a fine pitch. The cavities 34 extend from the first side 20 of the first SOI wafer 12 inward and have dimensions corresponding to the MEMS devices which cavities 34 are configured to form. Such MEMS devices may include electromechanical components, such as transducers (e.g. cMUTs) and/or sensors configured to operate in ultrasonic systems. The MEMS may also include photodetectors and/or photo-transceivers, as well as X-ray sensors. As will be appreciated by those of ordinary skill in the art, fabrication of MEMS cavities 34 may include processing the bulk wafer using multiple standard micromachining methods and techniques. Such techniques may include photolithography-patterning, dry or wet etching, inductively coupled plasma (ICP), chemical vapor deposition (CVD), chemical mechanical planarization (CMP) and so forth. It should be appreciated that during fabrication process certain steps may be performed to maintain structural support. In one exemplary embodiment, fabrication of cavities 34 is performed such that the portion of the silicon layer 32 lying between the insulation layer 18 and the depth of the cavities 34 retains thickness sufficient for providing structural support to the cavities 34 throughout fabrication processes of the first SOI wafer 12.

Figure 1D:
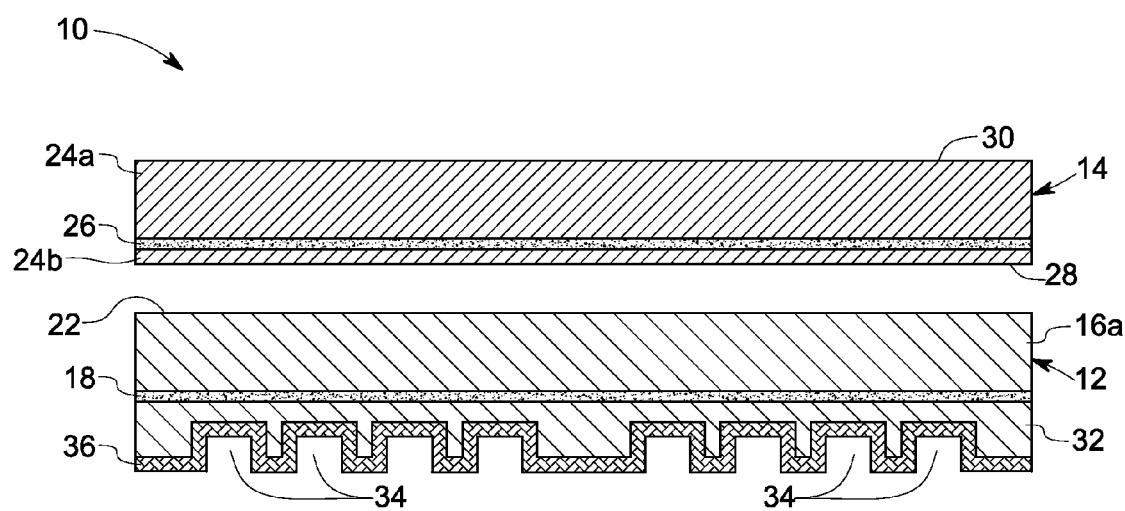

FIG. 1D illustrates a subsequent step in the fabrication process of the stack 10 in accordance with the present technique. Accordingly, using chemical vapor deposition (CVD), thermal oxide or other deposition methods, a thin insulation layer 36, such as a silicon dioxide layer is conformally grown/deposited over the bottom portion of the wafer 12, that is, over the surface of cavities 34. The insulation layer 36 is adapted to electrically insulate the MEMS comprised of cavities 34 from the wafer 12 and other electrical components contained therewith.

Figure 1E:
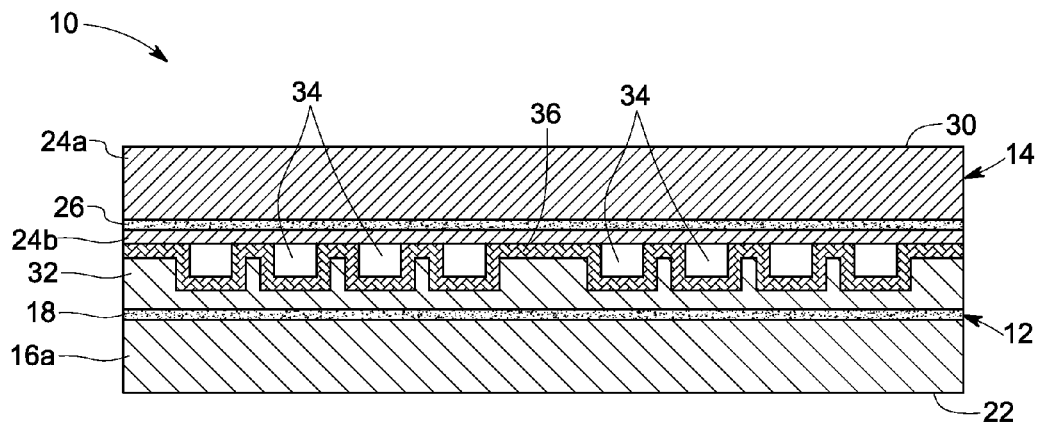

As illustrated in FIG. 1E, after cavities 34 are micromachined in the SOI wafer 12 and the layer 36 is conformally deposited on the cavities 34, the first SOI wafer 12 is inverted and bonded with the second SOI wafer 14 such that the insulation layer 36 contacts the first side 28 of the second SOI wafer 14. In some embodiments, the insulation layer 36 is maintained flush with cavities 34, thereby forming an etch stop for subsequent etch processing of the second SOI wafer 14, as further discussed below. The above configuration in which the second SOI wafer 14 is bonded to the first SOI wafer 12 enables the wafer 12 to provide additional structural support to the cavities 34 once the wafer 14 is subsequently ground or etched.

Figure 1F:
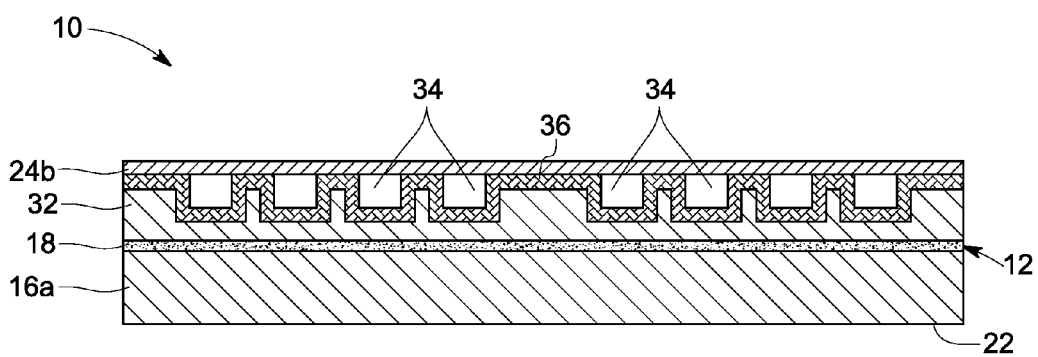

Next, FIG. 1F depicts a subsequent fabrication step of stack 10 in which the bottom portion (layer 24a and layer 26) of the second SOI wafer 14 is removed. Removing portions of the second SOI wafer 14 may be facilitated by grinding or etch or CMP processing or a combination of these. In the illustrated embodiment, most of the second SOI wafer 14 is removed such that a thin portion of the layer 24b, for example 1 micron in thickness remains attached to the cavities 34 or to the bottom portion of the stack 10. Removing the majority of the second SOI wafer 14 so that it retains such a small thickness is facilitated by the structural support provided by the first SOI wafer 12. At this stage the sensor array is testable. The sensor array is tested to identify operational (good) and non-operational (bad) units that form the sensor array. In case of MEMS sensor array, the units may include MEMS membranes. In case of photodiodes, the units may include the individual photodiodes that form the part of the of the sensor array. Once tested and identified, the good and bad units may be marked such that in the later stages of the fabrication process, the CMOS dies may be attached to only the good units of the sensor array, thereby improving the yield of the fabrication process. In one embodiment, the MEMS cavities 34 may be probed by applying test signal and detecting the response drawn. For good cavities, resonance is observed at a particular frequency or in a range of frequencies in response to the test signal. However, for bad cavities no resonance is observed. In one embodiment, the MEMS cavities 34 may be probed by employing ultrasound technique. In this embodiment, a focused ultrasound beam may be scanned individually over each of the cavities 34. It should be noted that the size of the focused beam should not be greater than the size of the cavities 34. Obtaining a signal in response to the focused ultrasound beam reflects a good cavity and a lack of response reflects a bad cavity. While using the focused ultrasound beam, the assembly is placed in a water bath. In an alternate embodiment, instead of applying a focused ultrasound beam, a transducer probe of the size of the cavities 34 may be employed to individually test each of the cavities 34. The transducer probe physically contacts the top surface of the wafer 24b and thereby is configured to transmit sound to each of the cavities 24.

Figure 1G:
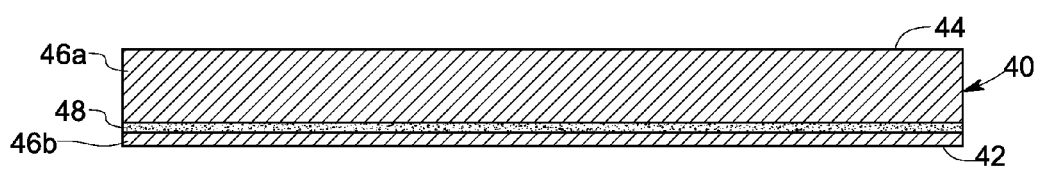
Figure 1H:
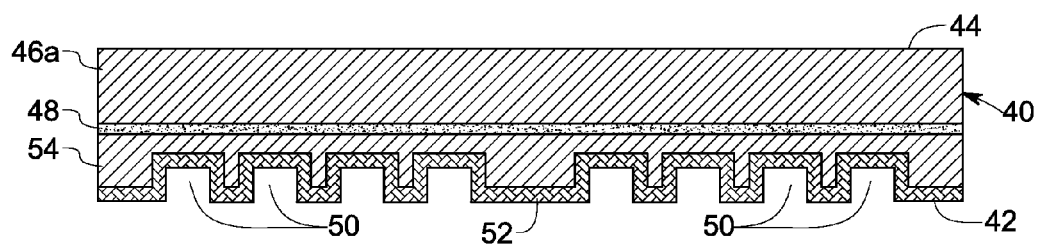

Turning now to FIGS. 1G and 1H, a third substrate or SOI wafer 40 having a first side 42 and a second side 44 is provided. The SOI wafer 40 includes a bulk wafer 46a, a silicon layer 46b, and an insulation layer 48. As with the first SOI wafer 12, the third SOI wafer 40 is processed to form cavities 50 having the conformal insulation layer 52 in the silicon layer 54 that is grown on the first side 42 of the third SOI wafer 40.

Figure 1I:
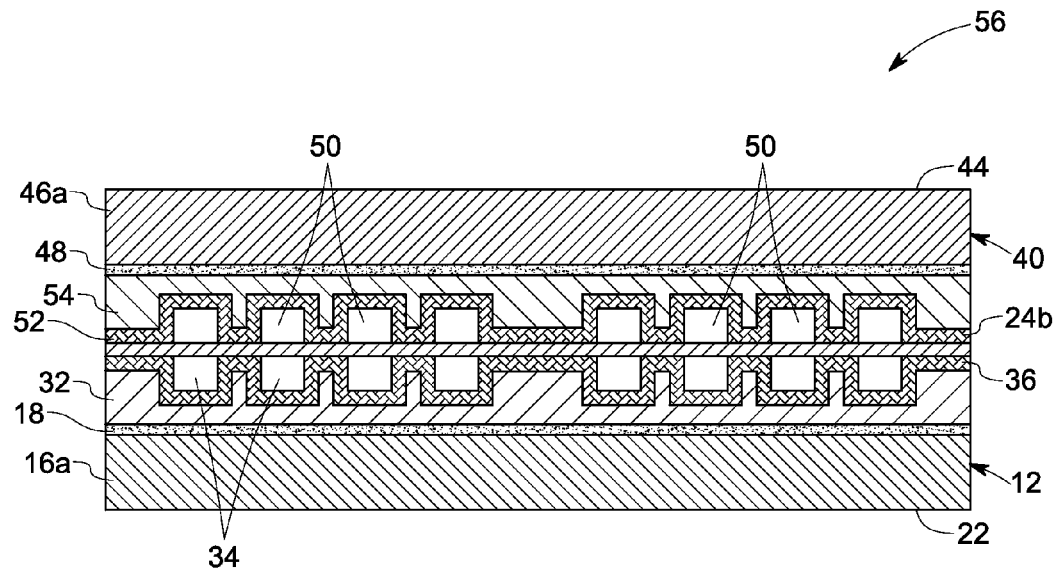

As illustrated in FIG. 1I, the first and third SOI wafers 12 and 40 having cavities 34 and 50, respectively, are coupled together to form the structure 56. Subsequently, a portion of one of the bulk wafers 16a or 46a is etched such that the insulations layers 18 or 48 are exposed, respectively. In the illustrated embodiment, the bulk wafer 16a is removed to expose the insulation layer 18. Removing the bulk wafer, such as the wafers 16a or 46a, may be facilitated by grinding or etch or CMP processing or a combination of these.

Figure 1J:
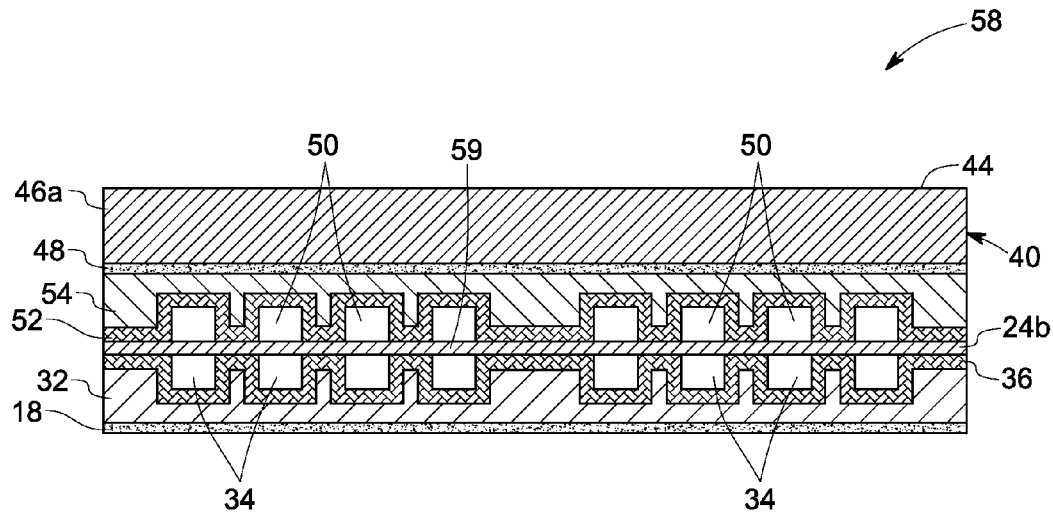

As illustrated in FIG. 1J, the resultant structure 58 contains free internal membranes 59. The term "free internal membranes" refers to the membranes that are disposed within two cavities (for example, cavities 34 and 50) such that upon applying voltage the membranes may deflect in the direction of either of the cavities. As with the structure of FIG. 1F, the structure 58 contains testable units or sub-assemblies 61 and 63 of the sensor array. The free internal membranes 59 can be tested to identify good and bad units in the sensor array. For example, the testing may be done by individually applying voltage across each of the units of the sensor array Since this testing can be accomplished right before the arrays are integrated with the CMOS chips, it is able to detect completed poorly yielding transducer devices. Further, the devices are protected from further processing and will remain largely intact so that the testing may provide a good representation of the final yield.

Figure 1K:
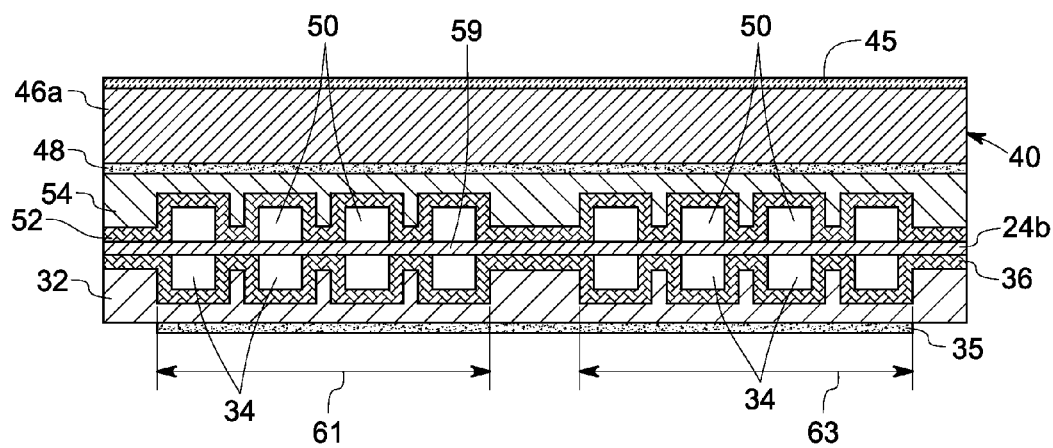

As illustrated in FIG. 1K, subsequently, the insulation layer 18 is removed to expose the silicon layer 32. If the silicon layer 32 is selected to be non-conductive, then the regions beneath each cavity 34 may be selectively doped so as to create a bottom electrode in the cavity 34. A metal electrode 35 may then be applied to the regions that have been doped in order to allow for testing of the individual sub-elements 61 and 63. Alternatively, if the silicon layer 32 is selected to be conductive, isolation trenches (not shown) may be etched between each sub-element, such as sub-elements 61 and 63. As above, electrodes 35 may be applied to each sub-element for testing of the functionality. A second electrode or a top electrode 45 is also required for testing. If the silicon layer 24b is highly doped such that it is conductive, then the layer 24b can act as the second electrode.

Figure 2A:
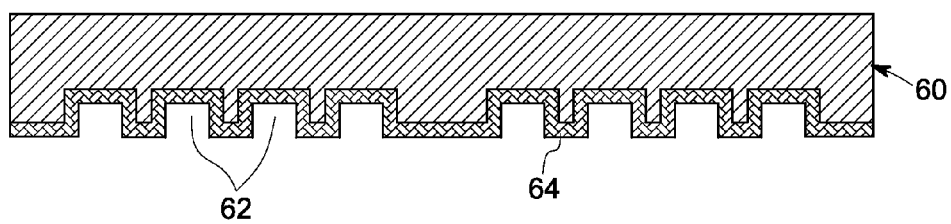
FIGS. 2A-2C illustrate an alternate fabrication method for a testable MEMS sensor array, in accordance with an exemplary embodiment of the present technique.
Figure 2B:
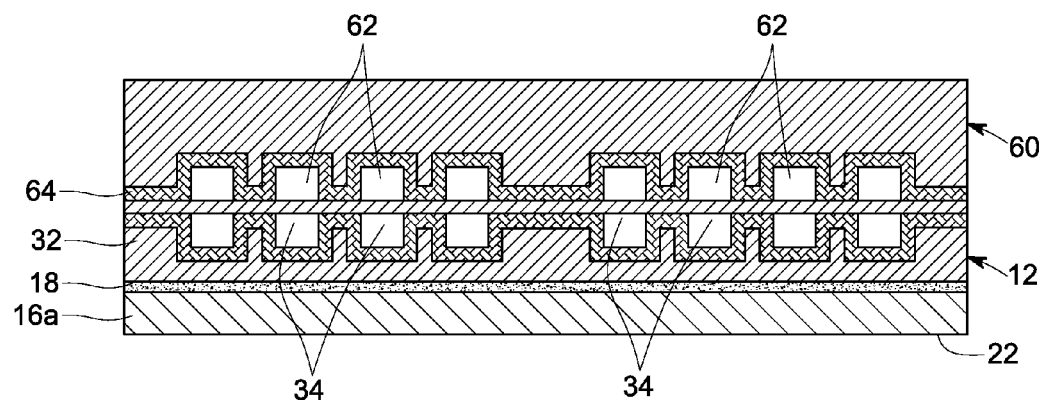
Figure 2C:
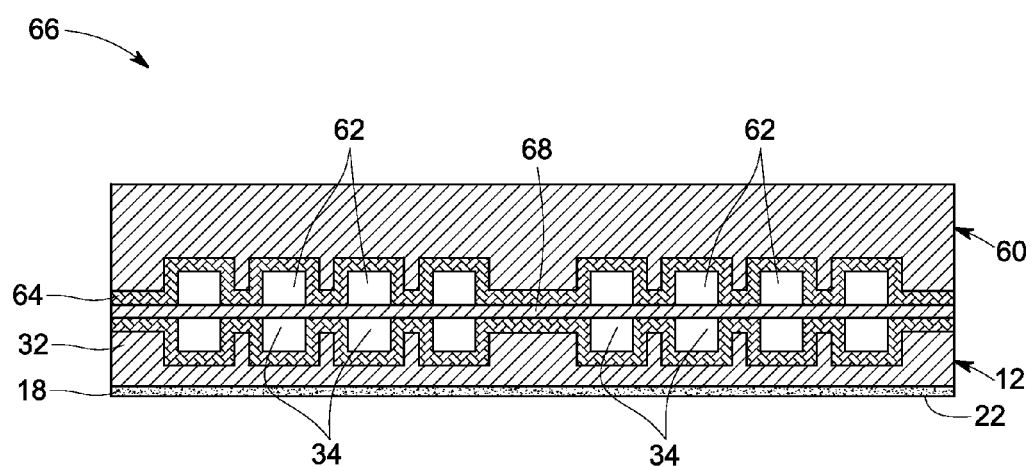

FIGS. 2A-2C illustrate an alternate fabrication method of forming the structure 58 of FIG. 1J. Instead of employing three SOI wafers to form free testable membranes, a semiconductor wafer, such as silicon wafer, may be employed in place of the third SOI wafer to achieve the structure 58 of FIG. 1J. In the illustrated embodiment of FIG. 2A, a silicon wafer 60 is provided with cavities 62 and a conformal insulation layer 64 disposed on the cavities 62. The silicon wafer 60 is then coupled to the SOI wafer having cavities and conformal insulation layer to provide free testable membranes. For example, the silicon wafer 60 may be coupled to the first SOI wafer 12 of FIG. 1F.

Next, as illustrated in FIG. 2C, at least a portion of the bulk wafer 16a (see FIG. 2B) is removed to obtain the structure 66 having free testable membranes 68. Removing the portions of the bulk wafers may be facilitated by grinding or etch or CMP processing or a combination of these. As will be appreciated, both the structures 66 and 58 (FIG. 1J) include free testable membranes, namely 68 and 59, respectively.

Figure 3A:
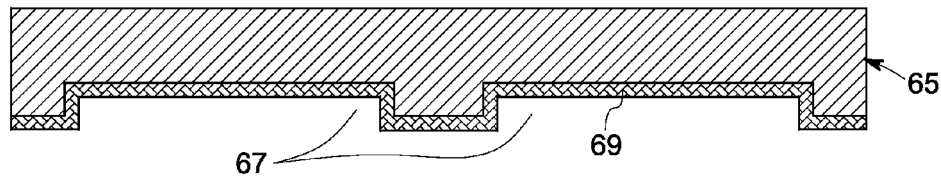
FIGS. 3A-3C illustrate an alternate fabrication method for a testable MEMS sensor array, in accordance with an exemplary embodiment of the present technique.
Figure 3B:
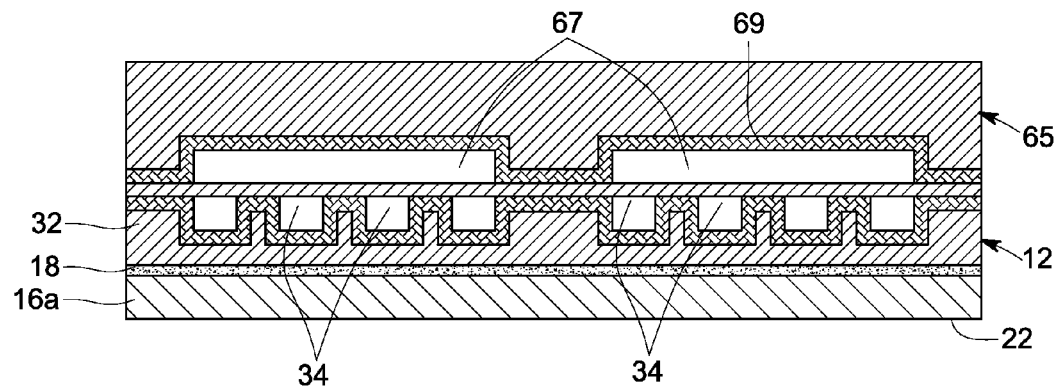
Figure 3C:
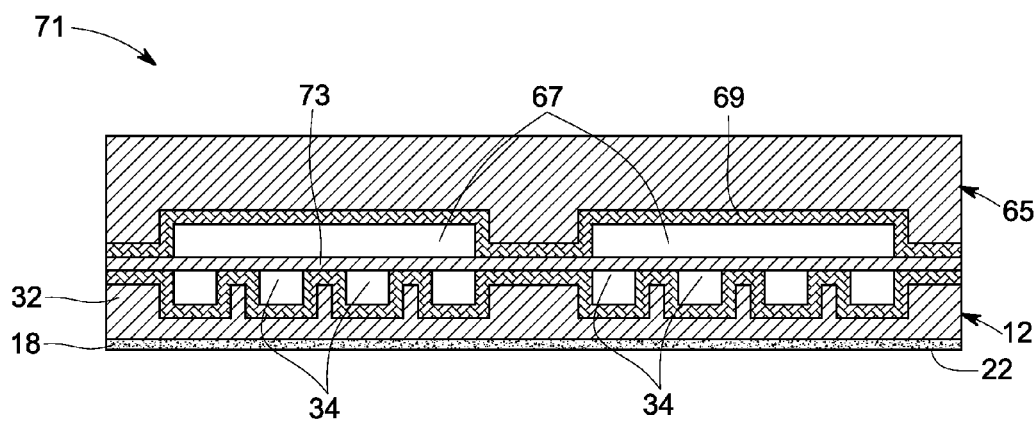

Turning now to FIGS. 3A-3C an alternate fabrication method of forming a structure having testable free internal membranes is illustrated. As with the method of FIGS. 2A-2C instead of employing three SOI wafers to form free testable membranes, a silicon wafer may be employed in place of the third SOI wafer. As illustrated in FIG. 3A, a silicon wafer 65 having cavities 67 and a conformal insulation layer 69 on the cavities 65 is provided. The silicon wafer 65 is then coupled to the SOI wafer having cavities and conformal insulation layer to provide free testable membranes. For example, the silicon wafer 65 may be coupled to the first SOI wafer 12 of FIG. 1F. As shown in FIG. 3B, in the presently contemplated embodiment, the cavities 69 of the silicon wafer 65 may not necessarily be the replica of the cavities 34 of the first SOI wafer 12, for example. As shown, the area of each of the cavities 65 is individually similar to the sum of the areas of the cavities 34 of each of the sub-elements 61 and 63 separately, thus allowing reduced alignment tolerance while bonding the silicon wafer 65 with the SOI wafer. Next, as illustrated in FIG. 3C, at least a portion of the bulk wafer 16a (see FIG. 3B) is removed to obtain the structure 71 having free testable membranes 73. As mentioned previously, removing the portions of the bulk wafers may be facilitated by grinding or etch or CMP processing or a combination of these.

Figure 4A:
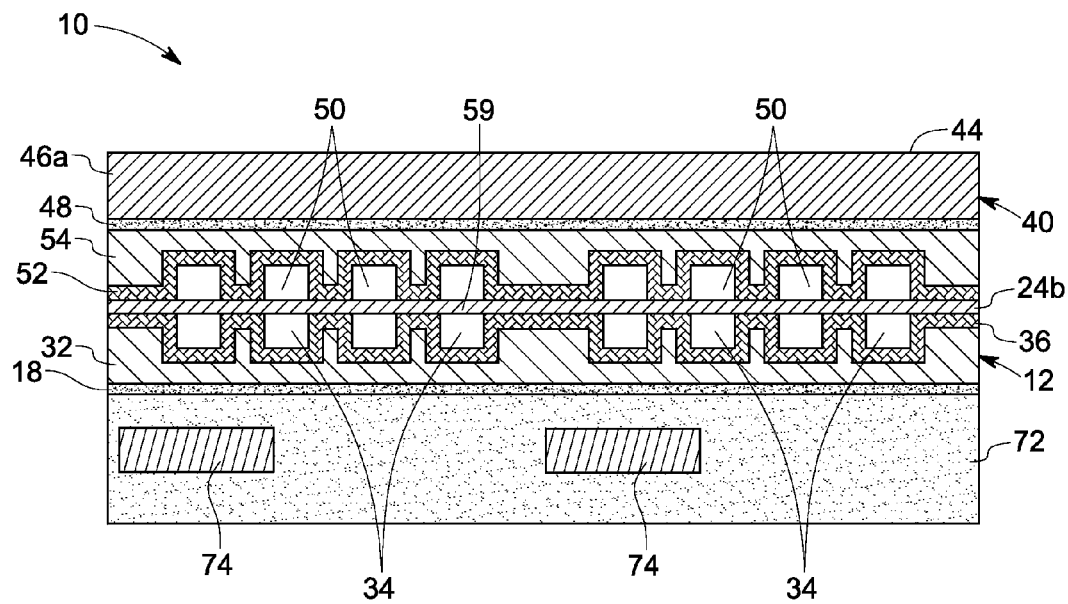
FIGS. 4A-4F illustrate a fabrication method for a MEMS/CMOS wafer assembly, in accordance with an exemplary embodiment of the present technique.
Figure 4B:
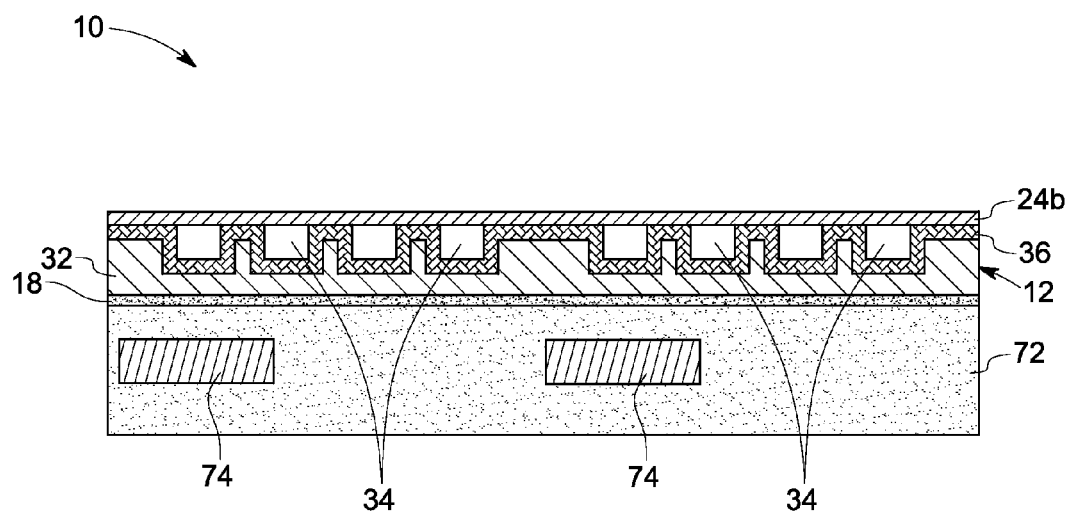
Figure 4C:
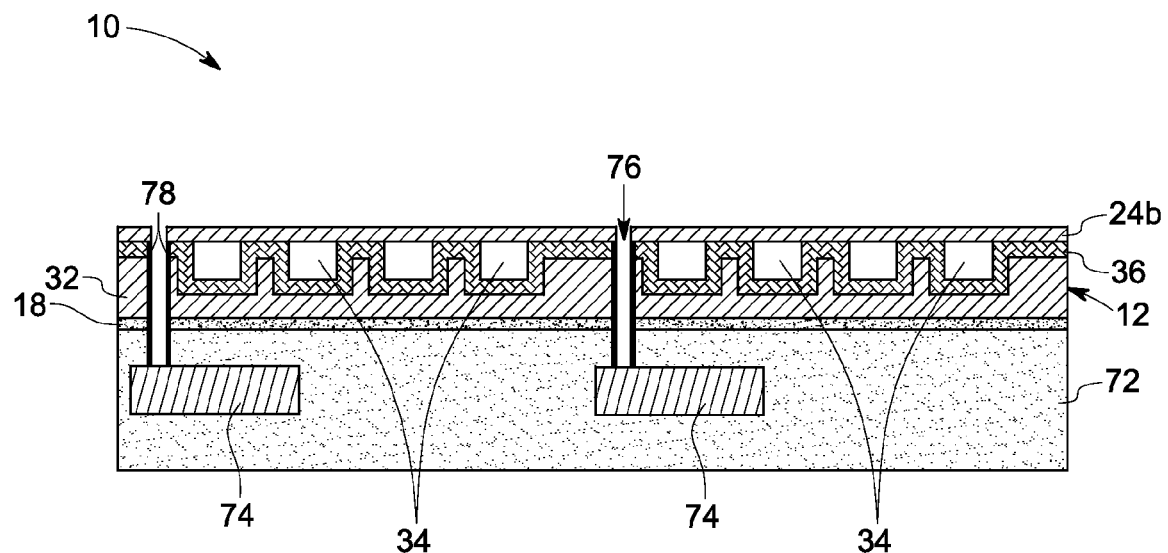

FIG. 4A illustrates a method of coupling a plurality of integrated circuit dies to respective ultrasound transducer arrays. In the illustrated embodiment, the integrated circuit dies, such as CMOS dies, are bonded using an epoxy. Embodiments of FIGS. 4A-4C are explained with respect to the structure 58 of FIG. 1J, however, as will be appreciated, the embodiments of FIGS. 4A-4C may also be applied to the structures 66 and 71 of FIGS. 2C and 3C, respectively. In the subsequent processing of the structure 58, the insulation layer 18 is potted with a potting compound 72, such as an epoxy adhesive. Potting material/epoxy 72 may be configured for patterning using photolithography or other pattern creating techniques. Further, epoxy layer 72 is configured to bond CMOS devices 74 to the structure 58 to facilitate integration between CMOS devices 74 and the MEMS devices comprised of cavities 34. It may also be desirable to use a first epoxy layer that is best adapted for providing a good contact and a thin layer between the CMOS device and the MEMS, while using a second epoxy as the potting material which has different material properties. CMOS devices 74 may be fabricated on silicon wafers using standard VLSI or ULSI methods, as will be appreciated by those of ordinary skill in the art. After their fabrication, the wafers on which CMOS dies 74 are fabricated undergo standard validation testing to determine whether each of the CMOS dies functions as expected, so that the die can be integrated with the MEMS devices in a single stack, such as in stack 10. Thereafter, the wafers are diced and the validated CMOS dies are then placed within the potting material 72. Integrating only valid CMOS dies with the MEMS devices, results in a higher yield of operational stacks 10.

As mentioned above, CMOS dies 74 may be placed within potting material 72 in a manner exposing electronic components of CMOS dies 74 to the SOI wafer 12. In so doing, the CMOS dies 74 can be coupled to MEMS devices comprised of cavities 34 with relative ease. In coupling CMOS dies 74 to the wafer 12, a lamination press may be employed to squeeze out potting material 72, thereby bringing CMOS dies 74 as close as possible to the wafer 12. This may make subsequent processing steps easier and/or more accurate. After placing CMOS dies 74 within the potting material 72, stack 10 may further be potted with potting material 72 so as to increase its thickness. This may further provide structural support for stack 10 during subsequent processing steps.

FIG. 4B depicts further processing steps of stack 10 in accordance with an embodiment of the present technique. Accordingly, in the illustrated embodiment, stack 10 is further processed so that a portion of the third SOI wafer 40 is removed, leaving thin silicon layer 24b on top of the cavities 34. During this process, epoxy layer 72 provides suitable structural support for stack 10 as a portion of the SOI wafer 40 is removed, as well as during subsequent processing steps. As discussed further below, alternative embodiments may utilize other means and/or structures for supporting stack 10 during its processing.

After removal of the SOI wafer 40, the stack 10 is further processed, as shown by FIG. 4C. Accordingly, in this fabrication step, vias 76 are formed within stack 10, for example, using laser drilling or etch processing. As will be appreciated by those of ordinary skill in the art, certain fabrication and processing steps, such as photolithography patterning, dielectric deposition, metal deposition, dry or wet etching, chemical etching and so forth, precede and/or follow fabrication steps (not shown) resulting in the formation of vias 76 as depicted in FIG. 4C. As vias 76 are formed, metal layers of CMOS dies 74 provide an etch stop for etching. Etching of the vias is performed such that vias 76 extend from the surface of stack 10, i.e., from the silicon layer 24b, through potting layer 72, down to the metal layers of CMOS dies 74. Etching of the vias through epoxy layer 72 may be performed using plasma etching, or laser ablation with a focused beam (metal mask). Due to the reduced thickness of the stack 10, the length of each of the vias may be relatively short, which may reduce processing time of the stack 10 and also reduce the via diameter as compared to vias made in wafers/dies of standard thickness due to the requirement for a fixed aspect ratio during etching.

Additionally, a bottom electrode is required for the MEMS device. Typically, the bottom electrode may be formed/connected in one of the two ways. If the silicon layer is non-conductive, In order to create a connection to the bottom electrode, a via may also be etched at a different location in the sub-element, through the bottom electrode 35 (see FIG. 1K) that was previously applied for testing and then on to a pad on the die 74. If this via is coated directly with conductive material and not insulated from the substrate as with vias 76, then electrical connection may be made with the electrode 35 and to the die 74. Alternatively, if the layer 32 is conductive, silicon and isolation trenches 82 are only etched at the edges of a die 74. The layer 32 becomes a common electrode to all MEMS on one of the dies 74 and only a small number of vias are necessary to connect that electrode to die 74. This may not be necessary if the isolation trench is filled or coated with a conductive material such that the layer 32 for each sub-element is reconnected and thus is still a common, conductive silicon electrode.

Subsequent to their formation, vias 76 are conformally coated with an insulating material 78, such as oxide, nitride, or both, polyimide, or parylene. This may be achieved by conformally depositing the insulating material on stack 10. The insulating material 78 electrically insulates vias 76 from the wafer 12 so as to prevent current leakages from CMOS dies 74 to their surroundings within stack 10.

Figure 4D:
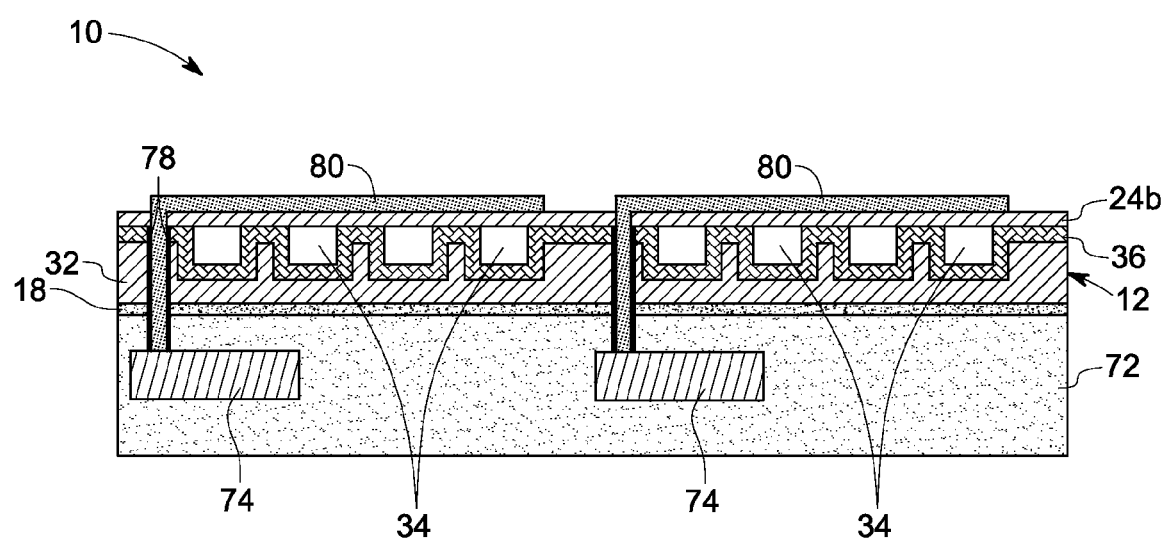

FIG. 4D illustrates subsequent processing steps of stack 10 in accordance with exemplary embodiments of the present technique. Accordingly, after their formation, each of the vias 76 is filled with a metal layer 80. Metal layers 80 may ultimately form electrodes of transducers and/or sensors used by systems, for which stack 10 may be fabricated. Metal layers 80 may be deposited or electroplated onto walls of the vias 76 such that they extend from CMOS dies 74 to the upper surface of the stack 10. Further, each of metal layers 80 may extend on top of the surface of the stack 10 to the extent that the metal layers 80 cover an array of cavities 34. Accordingly, deposition or electroplating of the metal layers 80 may be determined by the distance maintained between arrays formed by the cavities 34 or, in other words, by the pitch used in fabricating cavities 34.

Figure 4E:
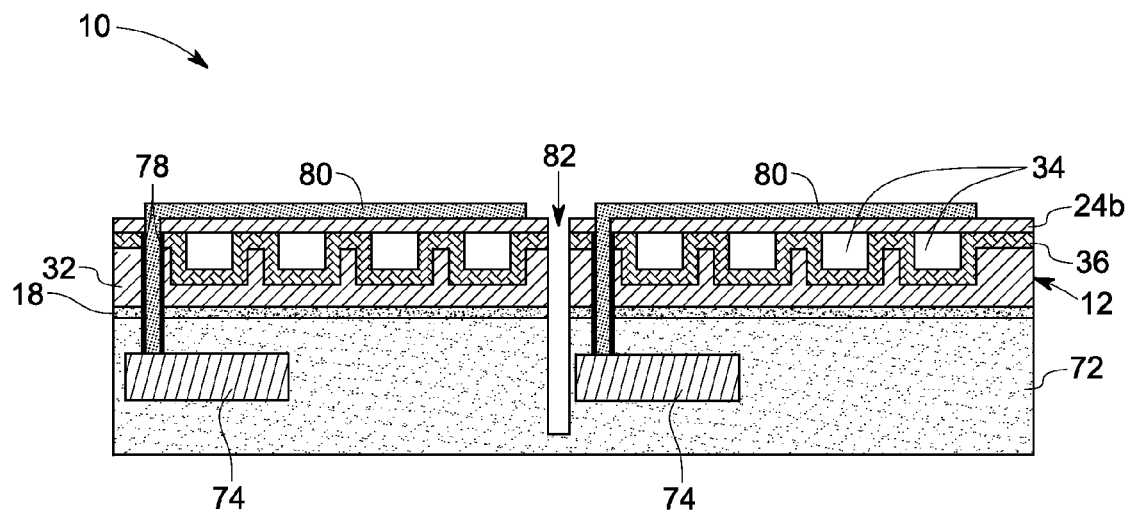

After depositing the metal layer 80, the processing of the stack 10 proceeds as shown in FIG. 4E, in accordance with an embodiment of the present technique. Accordingly, in this processing step a trench 82 may be etched through stack 10 such that the trench 82 is disposed between each of the metal layers 80, in other words, between arrays formed by cavities 34. The trench 82 may extend from the top of the stack 10, i.e., from the insulation layer 18 down to the potting layer 72, such that the trench 82 is disposed between the CMOS dies 74. The trench 82 may be etched, for example, using laser drilling or plasma etching. Trenches, such as trenches 82, may be fabricated throughout stack 10 so as to alleviate mechanical stresses that may exist between CMOS dies 74 and/or between the MEMS devices disposed in the cavities 34. The trenches may provide electromechanical isolation between the sensors.

As further depicted by FIG. 4E, a trench, such as the trench 82, may be fabricated across the stack 10 to render the stack more flexible. In so doing, the stack 10 may be able to flex upon a curved surface and, thus, conform to a desired geometry used in systems, such as ultrasonic systems. Additionally, the trenches 82 may also be etched from the backside to create a concave structure. For example, a substrate, such as an acoustic lensing material that is configured to transmit sound through the back of the stack 10 would be focused at points behind stack 10, thereby realizing a concave ultrasound array structure suitable for application to vascular monitoring. Curving of the array may be accomplished by etching from either side and curving in either a convex or concave shape, assuming the curving is not to the extreme that the opposing sidewalls touch. Etching may be a function of the amount of curvature and the width of the trench 82. In other words, concave curvature does not necessarily require etching from behind the stack 10 as stated.

Fitting stack 10 on a surface of a substrate may be done in conjunction with heating of the stack 10 so as to soften the epoxy layer 72 and further ease bending of the stack 10.

Figure 4F:
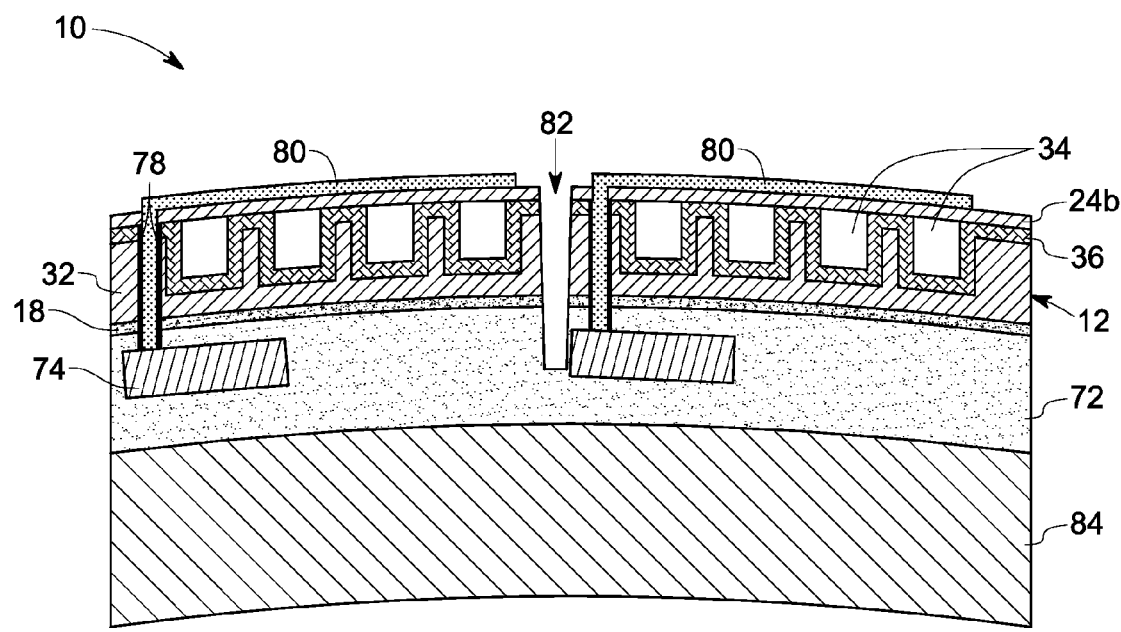

Accordingly, FIG. 4F illustrates the stack 10 flexed over a curved surface of a substrate 84, in accordance with an exemplary embodiment of the present technique. The substrate 84 may be curved in a particular manner enabling conformal fitting of the stack 10 to the surface of the substrate 84. In the illustrated embodiment, the substrate 84 is convex, bending the stack 10 accordingly. Such shaping of the stack 10 may be used, for example, in a volumetric ultrasound transducer for obstetrics scanning of patients. Although not illustrated, in an alternate embodiment, the trench 82 may be formed from the back to make a concave structure, which acts as an acoustic lens. Shaping the stack in this way could be used for example to produce a large cylindrical array or "cuff" for monitoring of limb vasculature.

FIGS. 5A-5G illustrate embodiments pertaining to a method of fabrication of testable sensor arrays of photodiodes. The process starts with providing a wafer stack 90 having a first SOI wafer 92 and a silicon wafer 94. The first SOI wafer 92 having a first side 100 and a second side 102 includes a bulk wafer 96a, a silicon layer 96b, and an insulation layer 98 disposed between the wafer 96a and the layer 96b. The silicon wafer 94 has a bulk wafer 104 and an insulation layer 106 disposed on the bulk wafer 104. Further, the silicon wafer 94 has a first side 108 and a second side 110. Although not illustrated, alternatively, a second SOI wafer may be employed in place of the silicon wafer 94.

Figure 5A:
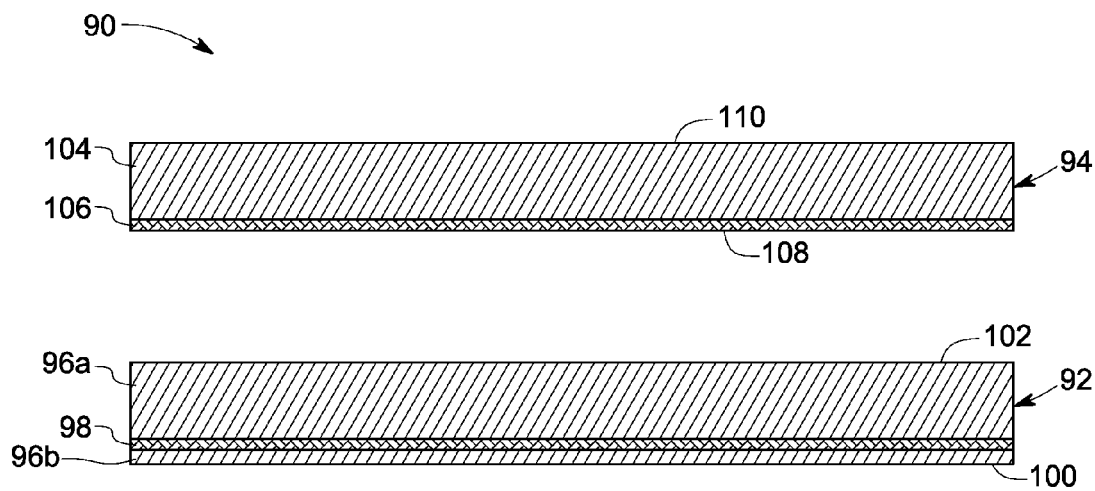
FIG. 5A-5F illustrates a fabrication method for a photodiodes/CMOS wafer assembly, in accordance with an exemplary embodiment of the present technique.
Figure 5B:
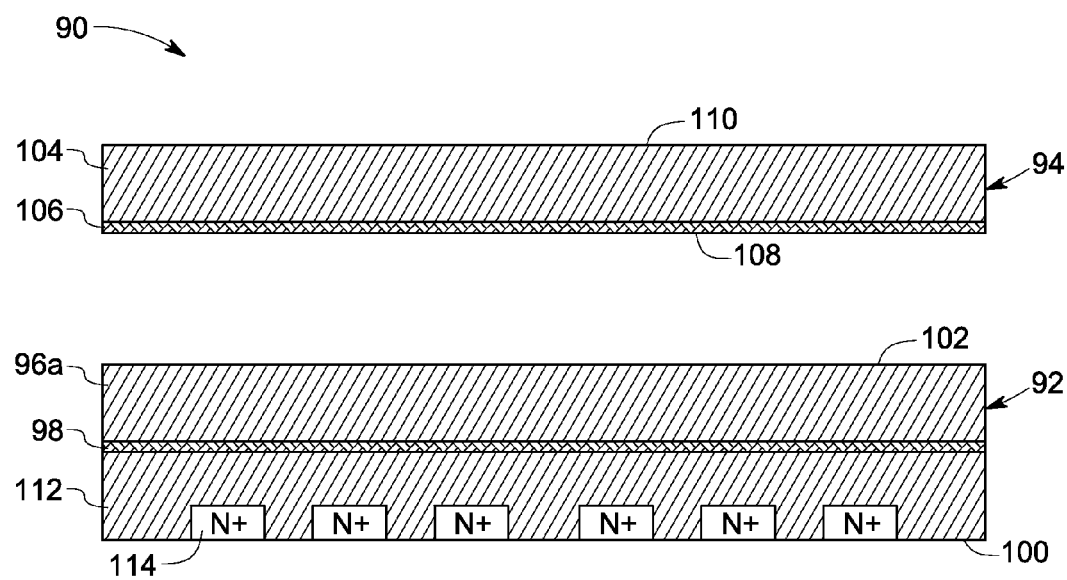

As illustrated in FIG. 5B, a silicon layer 112 is grown on the first side 100 of the first SOI wafer 92. The silicon layer 112 is doped to create a common anode. For example, the silicon layer 112 is doped p-type to create a common anode of the photodiodes. Subsequently, portions of the doped silicon layer 112 are oppositely doped to create diffusion regions 114. The doping concentration of the oppositely type doping to create diffusion regions 114 is kept higher than the first doping concentration. For example, initially, if the silicon layer is p-doped, the diffusion regions 114 may be created by $n^+$-type doping of selected portions 114 forming photodiodes. The photodiodes so formed may be tested to identify good and bad photodiodes from the array. For example, the photodiodes may be testing by applying voltage across each of the photodiodes.

Figure 5C:
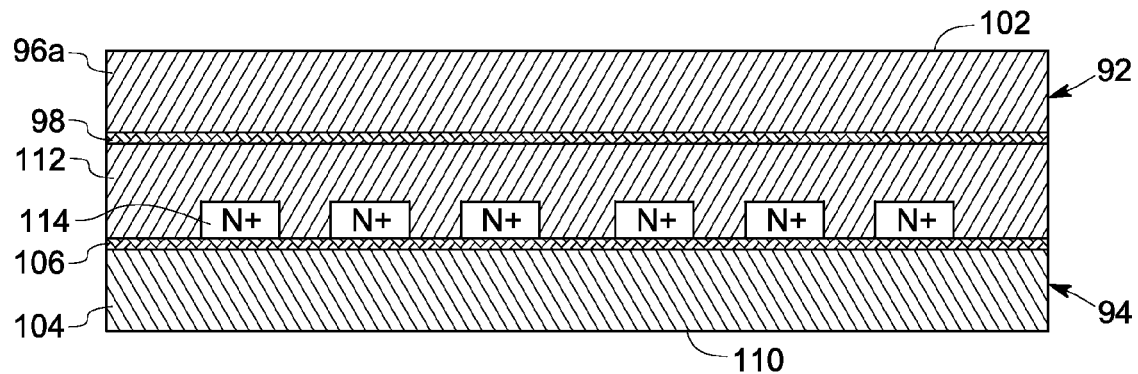
Figure 5D:
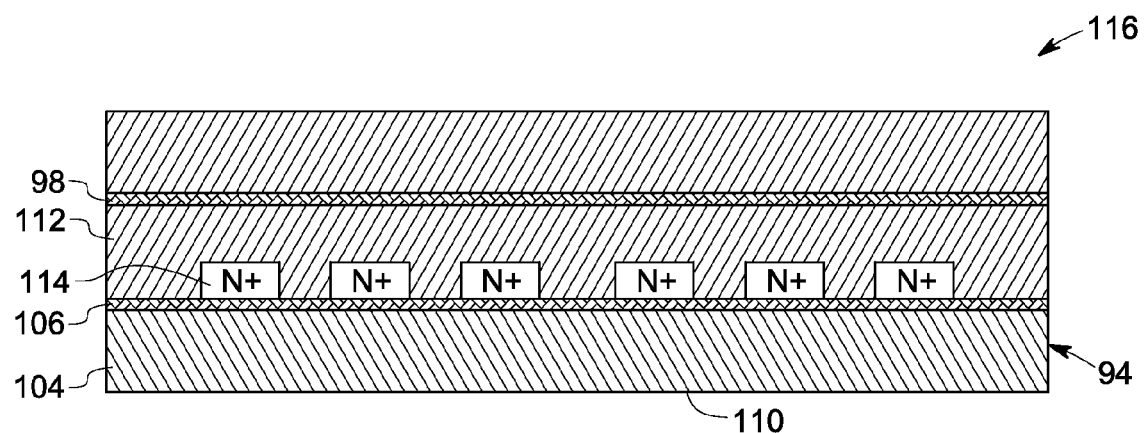

Further, as illustrated in FIG. 5C, the silicon wafer 94 may then be attached to the inverted first SOI wafer 92, such that the first side 100 of the first SOI wafer 92 is coupled to the first side 108 (see FIG. 5B) of the silicon wafer 94. Subsequently, one of the bulk wafers 96 or 104 may be removed by employing techniques, such as etching, grinding, as discussed above. In the illustrated embodiment of FIG. 5D, the bulk wafer 96 of the first SOI wafer 92 is removed such that the insulation layer 98 remains on the array of photodiodes.

Figure 5E:
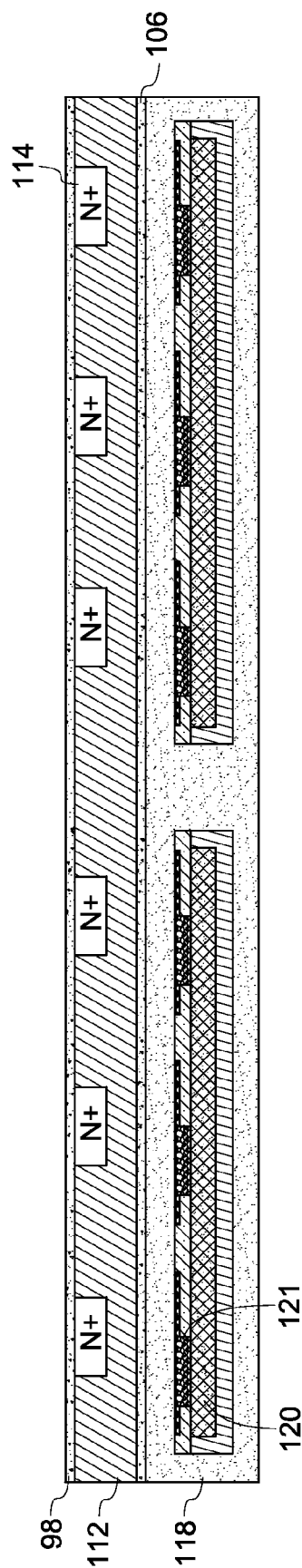

Further, as illustrated in FIG. 5E, the assembly 116 of the photodiodes is coupled to CMOS dies by employing potting as discussed above with regard to FIG. 4A. In the illustrated embodiment, an epoxy layer 118 having CMOS dies 120 with CMOS electronics 121 is integrated with the assembly 116.

Figure 5F:
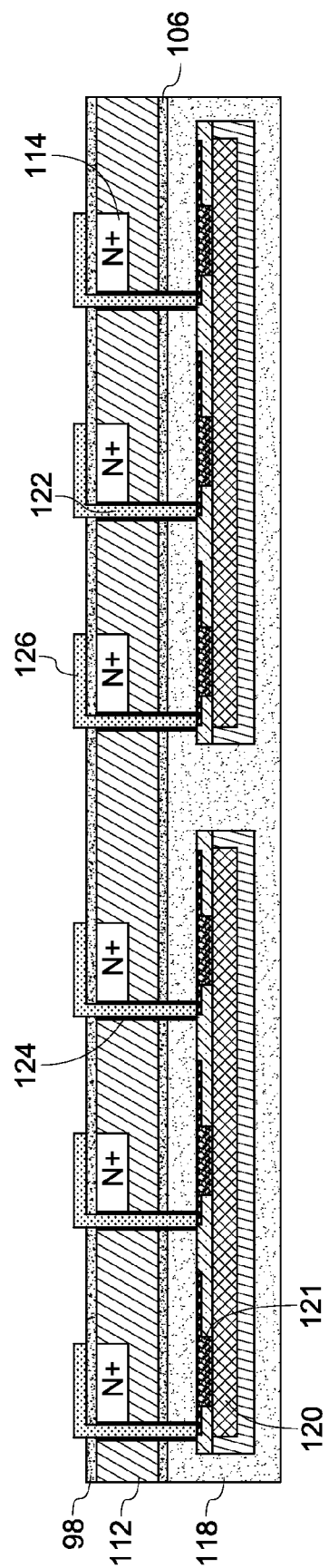

Next, as illustrated in FIG. 5F, vias 122 are formed. The vias 122 are then electrically isolated from the bulk wafer 96 by coating insulation coating 124. Further, patterned metal layer 126 is deposited on the top of the photodiodes and in the vias 122, such that the patterned metal layer 126 forms contact between the photodiodes and the CMOS dies 121. The patterned metal layer 126 is deposited only on small portions of the photodiodes as the oppositely doped $n^+$-type portions 114 are highly conductive. Also, covering only small portions of the photodiodes facilitates the light to reach the photodiodes.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for making a testable sensor assembly, comprising:
    forming a first sensor array on a first substrate having a first side and a second side, wherein the first sensor array is formed on the first side of the first substrate;
    coupling a first semiconductor wafer having a first side and a second side to the first sensor array, wherein the first side of the first semiconductor wafer is coupled to the first sensor array;
    thinning one of the second side of the first substrate or the second side of the first semiconductor wafer;
    coupling a second semiconductor wafer having a first side and a second side to the sensor assembly, wherein the second semiconductor wafer comprises a plurality of cavities disposed on the first side, and wherein the first side having the plurality of cavities is coupled to the thinned wafer
    thinning the second side of one of the second semiconductor wafer or the other of the first substrate to expose free internal membranes; and
    testing the first sensor array to identify operational and non-operational units in the testable sensor assembly before integration of the sensor assembly with interface electronics.

2. The method of claim 1, wherein the first semiconductor wafer comprises a semiconductor-on-insulator wafer.

3. The method of claim 1, wherein the first sensor array comprises photodiodes, chemical sensors, optical sensors, capacitive micromachined ultrasound transducers (cMUTs), microelectrical mechanical systems (MEMS) devices, photodetectors, photo-transceivers, X-ray sensors, or combinations thereof.

4. The method of claim 1, wherein forming the first sensor array comprises:
    forming a semiconductor layer on the first side of the first substrate;
    doping the semiconductor layer; and oppositely doping portions of the semiconductor layer to form p-n junction photodiodes.

5. The method of claim 1, further comprising testing the free internal membranes to determine locations of operational and non-operational MEMS devices in the sensor assembly.

6. The method of claim 1, comprising metallizing an upper surface of the sensor array.

7. The method of claim 1, comprising forming a trench through a layer of the sensor array to alleviate stresses within.

8. The method of claim 1, wherein forming the first sensor array comprises:
   depositing a layer of semiconductor on the first side of the first substrate; and
   forming a plurality of cavities in the layer of semiconductor.

9. The method of claim 8, further comprising doping the layer of semiconductor.

10. The method of claim 1, further comprising coupling a plurality of integrated circuit dies with the testable sensor assembly.

11. The method of claim 10, wherein coupling comprises bonding CMOS dies to the locations of the operational MEMS devices.

12. The method of claim 10, wherein coupling the plurality of integrated circuit dies comprises bonding the plurality of integrated circuit dies using an epoxy.

13. The method of claim 10, comprising forming vias from the operational devices of the sensor array to the integrated circuit dies.

14. The method of claim 13, further comprising conformally coating the vias with a conductive material to complete electrical connections to the integrated circuit dies.

15. The method of claim 1, comprising coupling a substrate to the back of the integrated circuit dies.

16. The method of claim 15, wherein the substrate is semi-rigid so that the integrated sensor can curve over a surface.

17. The method of claim 15, wherein the substrate is a flexible substrate.

18. The method of claim 1, further comprising:
   coupling a plurality of integrated circuit dies to the operational devices in the sensor array; and
   thinning at least a portion of the second side of the other of the first substrate or the first semiconductor wafer to expose the sensor array.

19. The method of claim 18, wherein coupling the plurality of integrated circuit dies comprises potting the thinned second side of the other of the first substrate or the first semiconductor wafer with epoxy.

20. The method of claim 19, further comprising heating the epoxy to mold the epoxy in a predetermined shape.

21. A method for making an integrated and testable MEMS array, comprising:
   forming a first plurality of MEMS cavities on a first substrate having a first side and a second side, wherein the first plurality of cavities are formed on the first side of the first substrate;
   coupling a second substrate having a first side and a second side to the first plurality of MEMS cavities such that the first side of the second substrate is coupled to the first plurality of MEMS cavities;
   thinning a second side of one of the first or second substrates such that at least a portion of a semiconductor layer of one of the first or second substrates is exposed;
   coupling a third substrate having a first side and a second side to the exposed semiconductor layer, wherein the third substrate comprises a second plurality of cavities disposed on the first side, and wherein the second plurality of cavities are coupled to the exposed semiconductor layer, such that the exposed semiconductor layer is configured to act as free internal membranes for the MEMS array;
   thinning the second side of one of the first, second or third substrates to expose an insulation layer;
   testing the MEMS array to determine good and bad free internal membranes;
   coupling a plurality of integrated circuit dies to the exposed insulation layer, wherein each of the plurality of integrated dies is coupled to portions of the good free internal membranes; and
   removing the second side of the remaining first, second, or third substrates.

22. A method for making an integrated and testable sensor array, comprising:
   forming a first plurality of sensor cavities on a first side of a first substrate, wherein the first substrate comprises the first side and a second side;
   coupling a second substrate to the first plurality of sensor cavities;
   thinning a second side of one of the first or second substrates such that at least a portion of a semiconductor layer of one of the first or second substrates is exposed to form a first exposed semiconductor layer;
   coupling a semiconductor wafer having a first side and a second side to the first exposed semiconductor layer, wherein the semiconductor wafer comprises a second plurality of sensor cavities disposed on the first side of the semiconductor wafer, and wherein the second plurality of sensor cavities is coupled to the first exposed semiconductor layer, and wherein the first exposed semiconductor layer forms an internal membrane for the second plurality of MEMS cavities;
   thinning the second side of the other of the first or the second substrates to expose an insulation layer to form the integrated and testable sensor array; and
   testing the internal membranes of the integrated and testable sensor array to determine operational and non-operational MEMS units of the array before coupling the sensor array with interface electronics.

* * * * *